(12) United States Patent
Liu et al.

(10) Patent No.: US 11,132,489 B1
(45) Date of Patent: Sep. 28, 2021

(54) LAYER ASSIGNMENT BASED ON WIRELENGTH THRESHOLD

(71) Applicant: Cadence Design Systems, Inc., San Jose, CA (US)

(72) Inventors: Derong Liu, Austin, TX (US); Yi-Xiao Ding, Austin, TX (US); Zhuo Li, Austin, TX (US); Mehmet Can Yildiz, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 12 days.

(21) Appl. No.: 16/805,155

(22) Filed: Feb. 28, 2020

(51) Int. Cl.
*G06F 30/3947* (2020.01)
*G06F 30/398* (2020.01)
*G06F 30/392* (2020.01)

(52) U.S. Cl.
CPC ........ *G06F 30/3947* (2020.01); *G06F 30/392* (2020.01); *G06F 30/398* (2020.01)

(58) Field of Classification Search
CPC .................................................. G06F 30/3947
USPC ....................................................... 716/129
See application file for complete search history.

(56) References Cited

U.S. PATENT DOCUMENTS

| | | | |
|---|---|---|---|
| 6,349,403 B1 * | 2/2002 | Dutta | G06F 30/394 716/129 |
| 2012/0240093 A1 * | 9/2012 | Alpert | G06F 30/394 716/129 |
| 2012/0284683 A1 * | 11/2012 | Alpert | G06F 30/394 716/129 |

* cited by examiner

*Primary Examiner* — Eric D Lee
(74) *Attorney, Agent, or Firm* — Schwegman Lundberg & Woessner, P.A.

(57) ABSTRACT

Various embodiments provide for layer assignment of a network of a circuit design based on a wirelength threshold, which can facilitate consideration of timing and electromigration and which may be part of electronic design automation (EDA) of a circuit design. More particularly, some embodiments determine (e.g., calculate) a wirelength threshold for a net (e.g., each net) of a circuit design based on one or more characteristics of the net, and select a layer for at least a portion of the net based on the wirelength threshold.

20 Claims, 9 Drawing Sheets

LAYER ASSIGNMENT BASED ON WIRELENGTH THRESHOLD

TECHNICAL FIELD

Embodiments described herein relate to circuit design and, more particularly, to systems, methods, devices, and instructions for layer assignment of a network of a circuit design based on a wirelength threshold, which may be part of electronic design automation (EDA).

BACKGROUND

Electronic design automation (EDA) software systems commonly perform layer assignment with respect to a circuit design, whereby a network (e.g., clock network) of the circuit design (or a portion thereof of the network) is assigned a specific layer of the circuit design for routing. For example, given a two-dimensional global routing tree for a circuit design, layer assignment of the circuit design can divide the 2D global routing tree into a list of nodes and can assign those nodes onto routing layers.

At present, conventional layer assignment emphasizes via costs when assigning networks (also referred to herein as nets) to layers, which usually results in more portions (more nets) of the circuit design being pushed to low layers of the circuit design (e.g., to reduce use of vias in the circuit design). Consequently, this can result in too many routes of the circuit design being disposed on the low layers (e.g., congestion issues for the low layers), a high number of design rule violations (DRVs) for the circuit design, and detrimental timing effects on the circuit design (e.g., from resulting high resistance of low layers). For instance, a large number of wires being routed on low layers of a circuit design (especially on double patterning technology (DPT) layers) can cause electromigration (EM) violations, which in turn can affect yield of the circuit design. At the same time, if layer assignment of the circuit design were to push a large number of wires to high layers of the circuit design, the via increase can result in worse timing effects for the circuit design (e.g., due to the increase via delays and high routing layers having lower capacity, which results in routing congestion). Additionally, current layer assignment methodologies often result in a sink side being assigned on the low layers (e.g., bounded by or using a threshold of 8 grid cells (GCells)) to facilitate lower power consumptions, which can be unsuitable for short nets.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
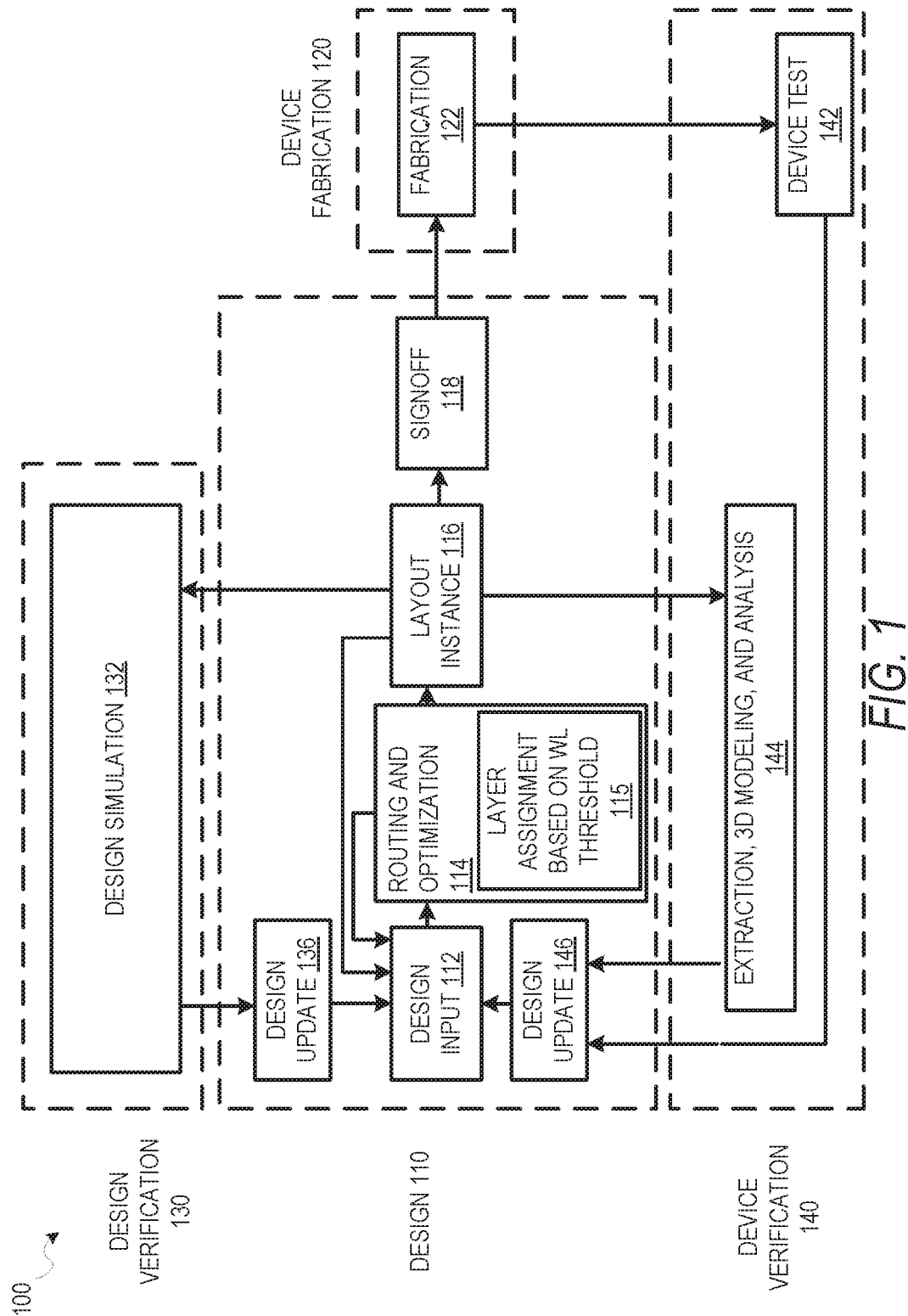
FIG. 1 is a diagram illustrating an example design process flow for layer assignment of a network of a circuit design based on a wirelength threshold for the network, according to some embodiments.

Various embodiments provide for layer assignment of a network of a circuit design based on a wirelength threshold, which can facilitate consideration of timing and electromigration and which may be part of electronic design automation (EDA) of a circuit design. More particularly, some embodiments determine (e.g., calculate) a wirelength threshold for a net (e.g., each net) of a circuit design based on one or more characteristics of the net, and select a layer for at least a portion of the net based on the wirelength threshold. By using one or more wirelength thresholds, some embodiments provide for layer assignment of a net of a circuit design that considers one or more timing effects on the circuit design, one or more electromigration violations, and vias, and that can further consider one or more inherent characteristics of the net, such as pins and net topologies. For instance, various embodiments consider a topological difference of each net of the circuit design, and selectively assign one or more wires of nets onto different layers of the circuit design.

Some embodiments can avoid or reduce assigning one or more nets of a circuit design unnecessarily. Accordingly, some embodiments can enable one or more wires to be routed on high layers of a circuit design, which can use big GCell design (e.g., such as 10×10 circuit row). By avoiding or reducing assignment of one or more nets of a circuit design to low layers of the circuit design, some embodiments can optimize and can avoid or reduce (e.g., alleviate) EM violations of the circuit design.

According to some embodiments, based on a two-dimensional routing topology for a given network of a circuit design, a wirelength threshold for the given network is determined (e.g., calculated), and one or more portions of the given network are assigned to a layer of the circuit design based on the wirelength threshold. For example, the two-dimensional routing topology can comprise a two-dimensional routing tree for the given network, and each edge of the two-dimensional routing tree can be assigned to a layer of the circuit design based on a wirelength of the edge in comparison to the wirelength threshold for the given network. For some embodiments, an edge of the two-dimensional routing tree is assigned to a layer of the circuit design having a minimum via cost (e.g., a low layer of the circuit design, such as metal layer two (M2) or metal layer three (M3)) in response to the a wirelength of the edge being less than the wirelength threshold for the given network. Additionally, for some embodiments, an edge of the two-dimensional routing tree is assigned to a preferred layer or a default layer (e.g., a high layer of the circuit design, such as metal layer four (M4) or metal layer five (M5)) of the circuit design in response to the a wirelength of the edge not being less than the wirelength threshold for the given network. In this way, some embodiments assign a wire (also referred to as a wire segment) of the given network that has a wirelength above the wirelength threshold to a high layer of the circuit design, and assign a wire of the given network that has a wirelength below the wirelength threshold to a layer of the circuit design based on via count (e.g., a low layer to minimize via count, which can address congestion issues or EM issues).

Various embodiments attempt to acquire a lower wirelength threshold for nets having more sinks or having shorter wirelength, and a higher wirelength threshold for nets having fewer sinks or having longer wirelength.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailed routing can route a physical wire between two or more nodes (e.g., pins) of a circuit design.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more DRCs associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for layer assignment of a network of a circuit design based on a wirelength threshold for the network, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes a layer assignment based on wirelength (WL) threshold 115 operation (hereafter, the layer assignment 115 operation), which may be performed in accordance with various embodiments described herein. For some embodiments, a layer assignment threshold 115 operation can be performed prior to detailed routing of a circuit design, during (e.g., as part of) global routing of the circuit design, or between global routing and detailed routing of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance.

As described in more detail below, a design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
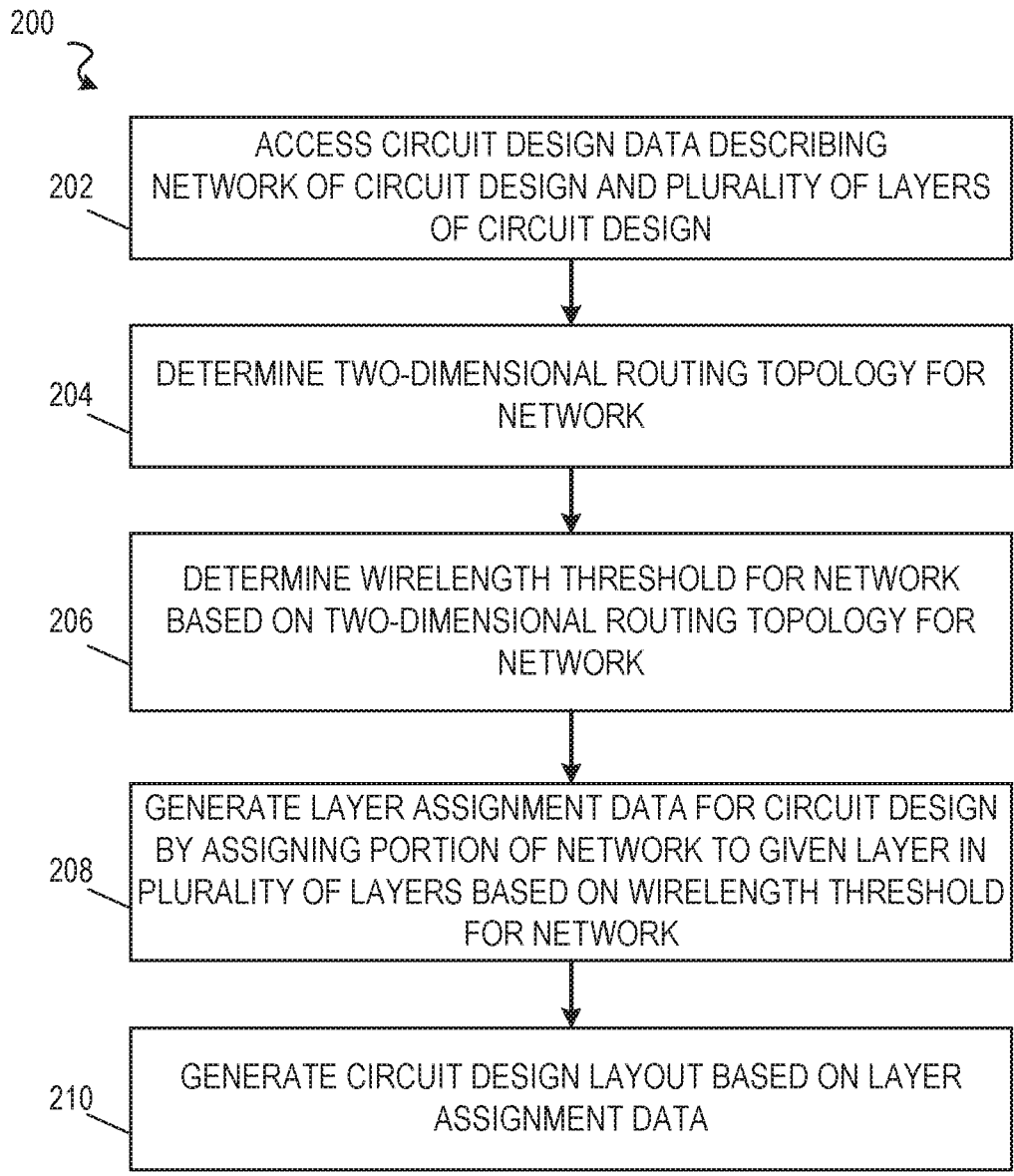
FIGS. 2 through 4 are flowcharts illustrating example methods for layer assignment of a network of a circuit design based on a wirelength threshold, according to some embodiments.
Figure 3:
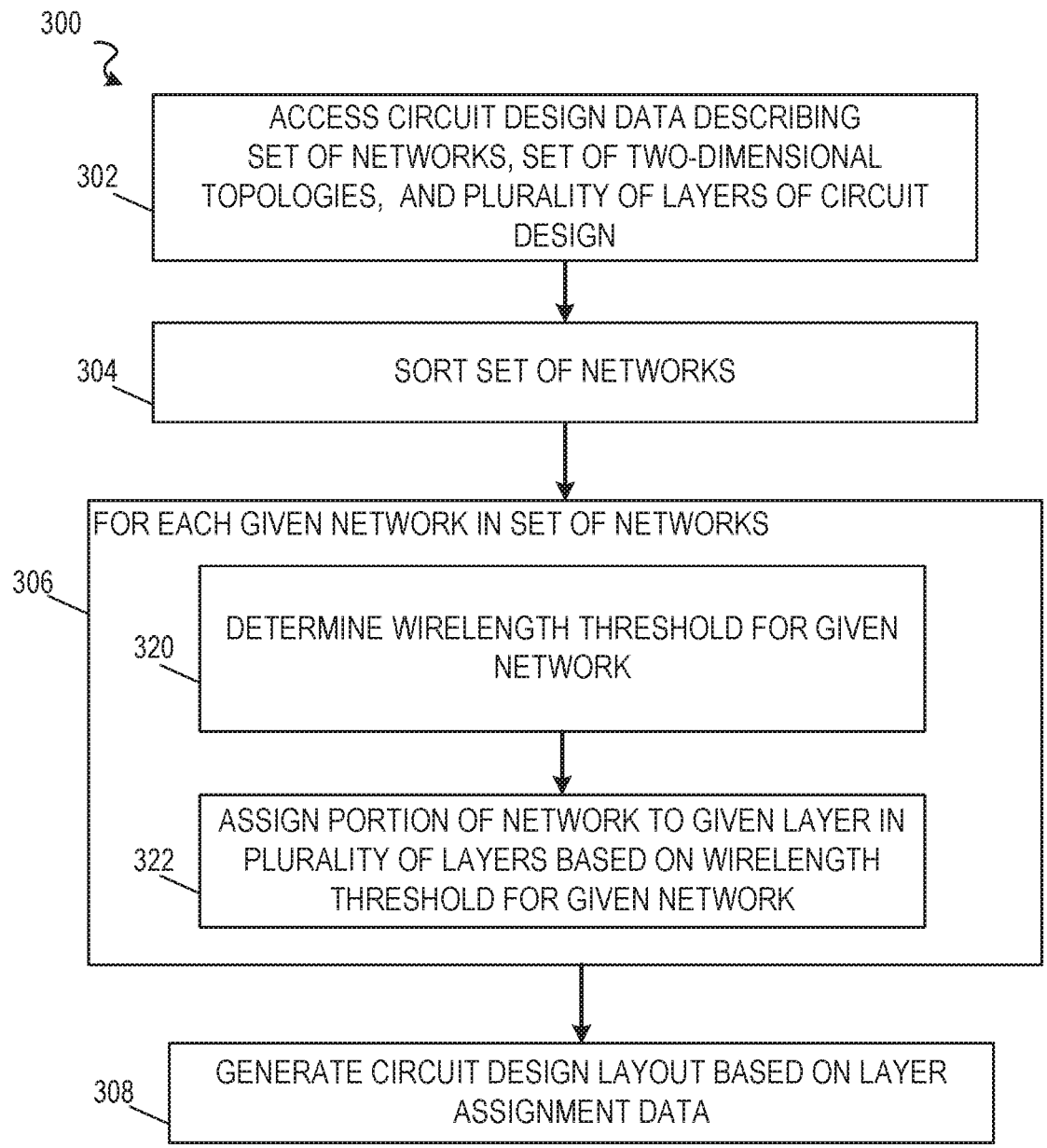
Figure 4:
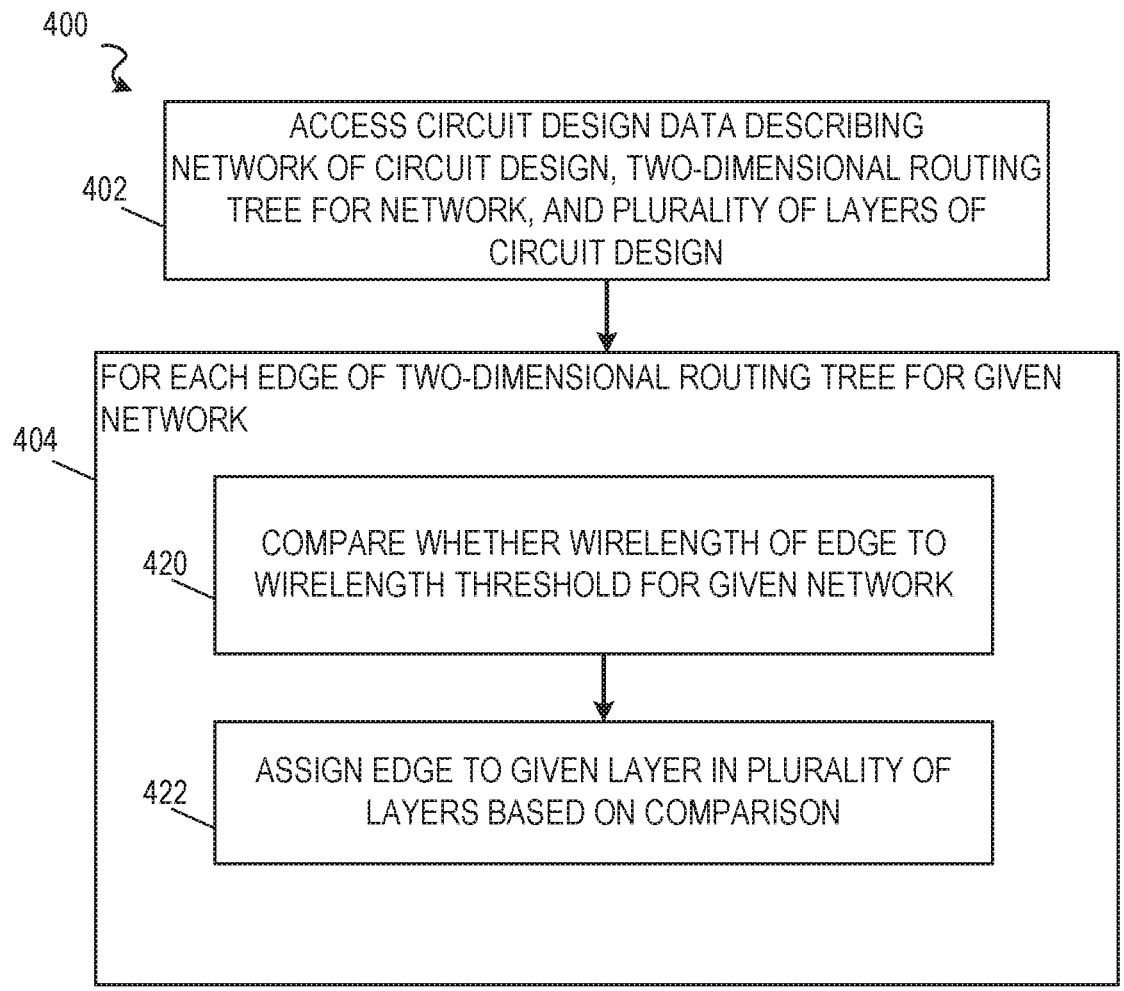

FIGS. 2 through 4 are flowcharts illustrating example methods for layer assignment of a network of a circuit design based on a wirelength threshold, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for layer assignment of a network of a circuit design based on a wirelength threshold, according to some embodiments. For some embodiments, one or more operations of the method 200 are performed as part of a global routing process performed with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

As illustrated, at operation 202, circuit design data is accessed, where the design data describes a network of a circuit design and describes a plurality of layers of the circuit design. Thereafter, at operation 204, a two-dimensional routing topology is determined (e.g., developed or generated) for a network of the circuit design. For some embodiments, the two-dimensional routing topology is developed in GCells for routing the network. For some embodiments, the circuit design data comprises a plurality of pins (e.g., for sources or sinks) for the network, and the two-dimensional routing topology is determined based on the plurality of pins. Additionally, for some embodiments, the two-dimensional routing topology comprises a two-dimensional routing tree, which can be generated by performing a global routing process on the network.

The method 200 continues with operation 206 determining (e.g., calculating) a wirelength threshold for the network based on the two-dimensional routing topology. For some embodiments, determining the wirelength threshold for the network based on the two-dimensional routing topology can comprise: determining a set of maximum distance values for the network; determining a sum of the set of maximum distance values; and determining the wirelength threshold for the network by dividing the sum by a two-dimensional wirelength of the network. Where the two-dimensional routing topology comprises a two-dimensional routing tree, determining the set of maximum distance values for the network can comprise determining, for each current node in the two-dimensional routing tree, a maximum distance value from the current node to a sink of the network. The two-dimensional wirelength of the network can be determined by determining the total length of wire present in the network.

At operation 208, layer assignment data is generated for the circuit design by assigning a portion of the network (e.g., a wire or wire segment) to a given layer in the plurality of layers based on the wirelength threshold for the network. For some embodiments, the two-dimensional routing topology comprises a two-dimensional routing tree, and the portion of the network (assigned by operation 208) comprises an edge of the two-dimensional routing tree. The edge of the two-dimensional routing tree can comprise (or represent) a wire segment of the network to be routed on an assigned layer of the circuit design. Where the portion of the network comprises (or is represented by) an edge of the two-dimensional routing tree, assigning the portion of the network to the given layer in the plurality of layers based on the wirelength threshold for the network can comprise comparing a given wirelength of the edge to (e.g., against) the wirelength threshold for the network, and assigning the edge to the given layer based the comparison. For instance, some embodiments determine whether the given wirelength of the edge is less than the wirelength threshold for the network, and assign the edge to the given layer based on determining whether the given wirelength of the edge is less than the wirelength threshold for the network. Depending on the embodiment, the edge can be assigned to a layer having a minimum via cost (e.g., a low layer of the circuit design, such as M2 or M3) in response to determining that the given wirelength of the edge is less than the wirelength threshold of the network, and the edge can be assigned to a preferred layer or a default layer (e.g., a high layer of the circuit design, such as M4 or M5) in response to determining that the given wirelength of the edge is not less than the wirelength threshold of the network.

Subsequently, the method 200 continues with operation 210 generating a circuit design layout based on the layer assignment data generated by operation 208. In comparison to the conventional methodologies for layer assignment, the circuit design layout generated by operation 210 can have better timing, fewer design rule violations (DRVs) (e.g., EM violations), or both.

Referring now to FIG. 3, the flowchart illustrates the example method 300 for layer assignment of one or more networks of a circuit design based on individual wirelength thresholds of those one or more networks, according to some embodiments. For some embodiments, the method 300 is performed on a plurality of networks of the circuit design. Like the method 200 of FIG. 2, one or more operations of the method 300 are performed as part of a global routing process performed with respect to a circuit design (e.g., by an EDA software system). An operation of the method 300 may be performed by a hardware processor.

As illustrated, at operation 302, circuit design data is accessed, where the design data describes a set of networks (e.g., two or more networks) of a circuit design, describes a set of two-dimensional topologies for the set of networks, and describes a plurality of layers of the circuit design. Thereafter, at operation 304, the set of networks is sorted based on the set of two-dimensional topologies. For example, the set of networks can be sorted based on an individual two-dimensional wirelength of each network in the set of networks.

The method 300 continues with operation 306 performing operations 320 and 322 for each given network in the set of networks as sorted by operation 304. While traversing the set of networks in sort order (e.g., according to longest to shortest wirelength, or according to shortest to longest wirelength), for each given network in the set of networks: operation 320 determines a wirelength threshold for the given network; and operation 322 generates layer assignment data for the circuit design by assigning a portion of the given network (e.g., wire segment of the given network) to a given layer in the plurality of layers based on the given wirelength threshold determined for the given network by operation 320.

Subsequently, the method 300 continues with operation 308 generating a circuit design layout based on the layer assignment data generated by operation 306. As noted herein, in comparison to the conventional methodologies for layer assignment, the circuit design layout generated by operation 308 can have better timing, fewer design rule violations (DRVs) (e.g., EM violations), or both.

Referring now to FIG. 4, the flowchart illustrates the example method 400 for layer assignment of one or more portions of a network of a circuit design based on a wirelength threshold of the network, according to some embodiments. In particular, according to some embodiments, the method 400 illustrates example layer assignment of edges of a two-dimensional routing tree of the network of the circuit design. For some embodiments, the method 400 is performed by operation 208 of the method 200 described above with respect to FIG. 2 or by operation 322 of the method 300 described above with respect to FIG. 3. Like the method 200 of FIG. 2, one or more operations of the method 400 are performed as part of a global routing process performed with respect to a circuit design (e.g., by an EDA software system). An operation of the method 400 may be performed by a hardware processor.

As illustrated, at operation 402, circuit design data is accessed, where the design data describes a network of a circuit design, describes a two-dimensional routing topology for the network, and describes a plurality of layers of the circuit design.

The method 400 continues with operation 404 performing operations 420 and 422 for each edge of the two-dimensional routing tree for a given network in the set of networks. For each given edge of the two-dimensional routing tree: operation 420 compares a wirelength of the given edge to (e.g., against) a wirelength threshold for the given network; and operation 422 assigns the given edge to a given layer (in the plurality of layers) based on the comparison performed by operation 420. For some embodiments, operation 420 comprises determining whether the wirelength of the given edge is less than the wirelength threshold for the given network, and assigning the given edge to the given layer based on determining whether the wirelength of the given edge is less than the wirelength threshold for the given network. Depending on the embodiment, the given edge can be assigned to a layer having a minimum via cost (e.g., a low layer of the circuit design, such as M2 or M3) in response to determining that the wirelength of the edge is less than the wirelength threshold of the given network, and the given edge can be assigned to a preferred layer or default layer (e.g., a high layer of the circuit design, such as M4 or M5) in response to determining that the wirelength of the edge is not less than the wirelength threshold of the given network. Additionally, for some embodiments, the given edge can be assigned in manner that considers routing congestion (e.g., in manner that avoids too many wires being routed on high layers).

Figure 5:
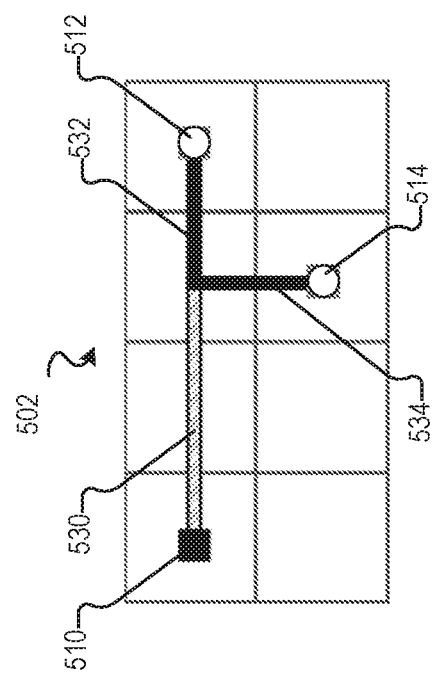
FIG. 5 is a diagram illustrating a comparison of layer assignment of an example network of a circuit design by conventional methodology versus layer assignment of the example network based on a wirelength threshold of the example network, according to some embodiments.
Figure 5:
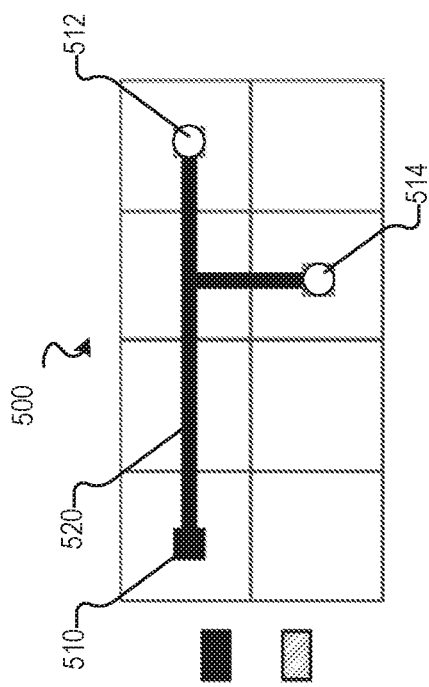

FIG. 5 is a diagram illustrating a comparison of layer assignment of an example network of a circuit design by conventional methodology versus layer assignment of the example network (of the circuit design) based on a wirelength threshold of the example network, according to some embodiments. In particular, schematic 500 illustrates the example network layer assigned by conventional methodology, and schematic 502 illustrates the example network layer assigned by an embodiment described herein. In schematic 500, the example network comprises a source node 510 (e.g., source pin) and sink nodes 512, 514 (e.g., sink pins), where wire segments 520 for routing between the source node 510 and the sink nodes 512, 514 (to form the example network) are assigned to metal layer two (M2) or metal layer three (M3). The conventional layer assignment methodology can include, for example, a layer assignment method that uses an 8 GCell threshold to layer assign the example network to metal layer two (M2) or metal layer three (M3). In schematic 502, the example network comprises the source node 510 and the sink nodes 512, 514, where a wire segment 530 routing from the source node 510 is assigned to metal layer four (M4) or metal layer five (M5), and where wire segments 532, 534 are assigned to metal layer two (M2) or metal layer three (M3).

Figure 6:
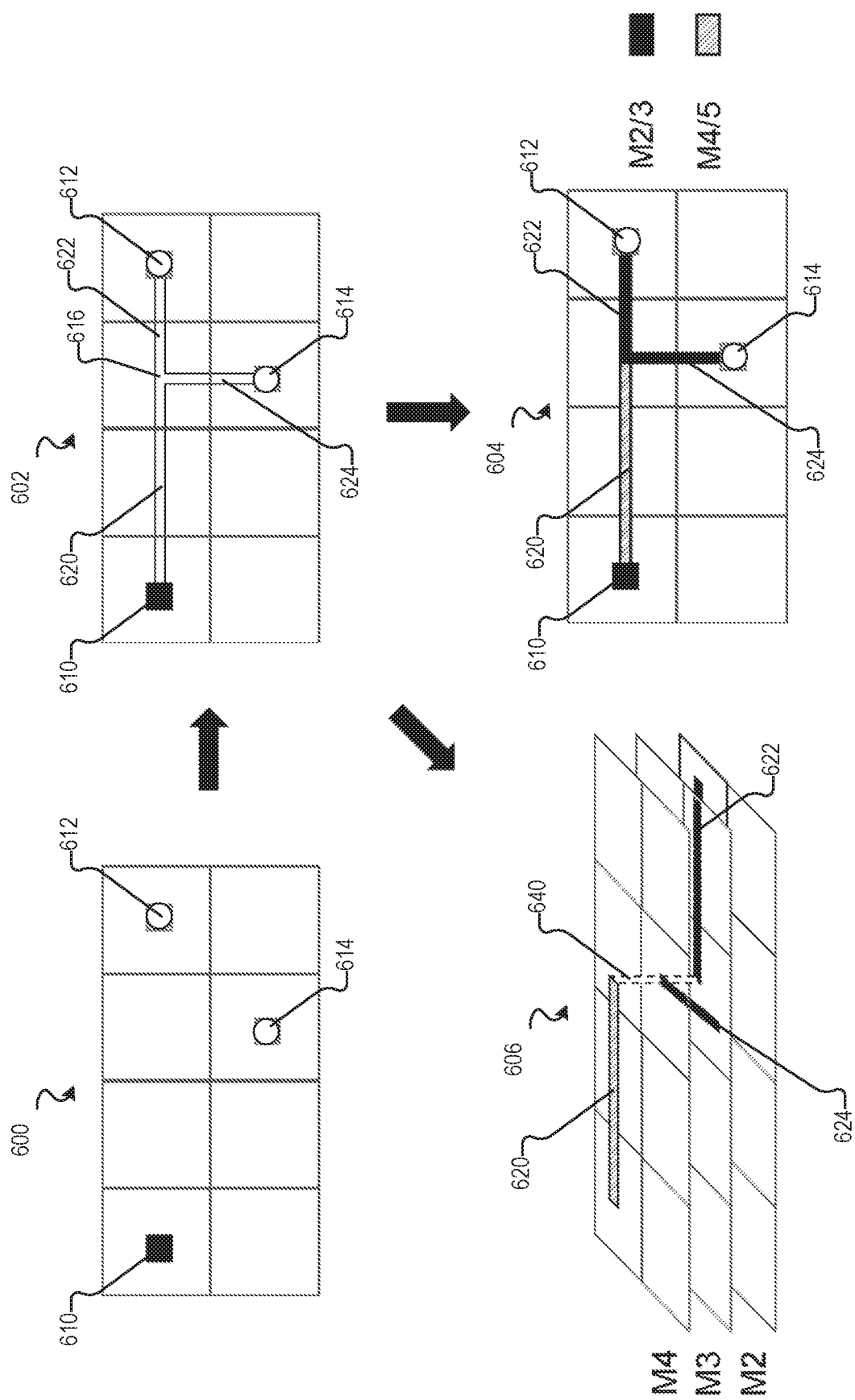
FIG. 6 is a diagram illustrating layer assignment of an example network of a circuit design based on a wirelength threshold of the example network, according to some embodiments.

FIG. 6 is a diagram illustrating layer assignment of an example network of a circuit design based on a wirelength threshold of the example network, according to some embodiments. In particular, schematic 600 illustrates a source node 610 (e.g., source pin) and sink nodes 612, 614 (e.g., sink pins) prior to global routing. Schematic 602 illustrates two-dimensional routing of the example network after performance of two-dimensional routing (e.g., global routing) on the example network, which results in wire segments 620, 622, 624 between the source node 610 and the sink nodes 612, 614 prior to layer assignment of those wire segments 620, 622, 624. For some embodiments, the wire segments 620, 622, 624 are each represented by edges of a two-dimensional routing tree generated by a two-dimensional routing process (e.g., global routing process), and the nodes 610, 612, 614 are represented as nodes in the two-dimensional routing tree. Accordingly, the schematic 602 can represent a two-dimensional routing tree for the example network. The wire segment 620 is between the source node 610 and a middle node 616, the wire segment 622 is between the sink node 612 and the middle node 616, and the wire segment 624 is between the sink node 614 and the middle node 616. Schematic 604 illustrates the example network after performance of layer assignment based on a wirelength threshold of the example network, according to some embodiments. As shown by schematic 604, the example network comprises the source node 610 and the sink nodes 612, 614, where the wire segment 620 is assigned to metal layer four (M4) or metal layer five (M5), and where the wire segments 622, 624 are each assigned to metal layer two (M2) or metal layer three (M3). Schematic 606 provides a three-dimensional perspective of the example network illustrated by schematic 604, where the wire segment 620 is assigned to metal layer four (M4), the wire segment 622 is assigned to metal layer two (M2), the wire segment 624 is assigned to metal layer three (M3), and a via 640 corresponds to the middle node 616 and connects the wire segments 620, 622, 624 between metal layers M2, M3, and M4.

Figure 7:
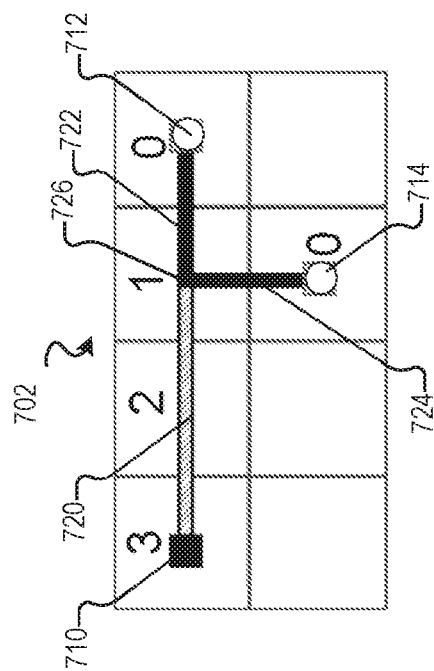
FIG. 7 is a diagram illustrating an example of determining a wirelength threshold for an example network of a circuit design, according to some embodiments.
Figure 7:
Figure 7:
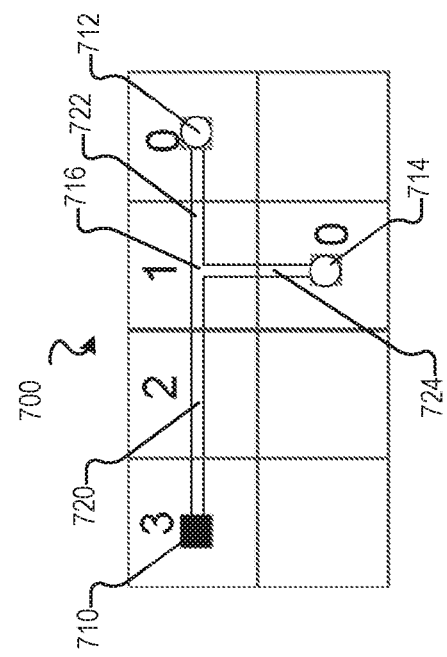

FIG. 7 is a diagram illustrating an example of determining a wirelength threshold for an example network of a circuit design, according to some embodiments. Schematic 700 illustrates the example network after two-dimensional routing, where a wire segment 720 is between a source node 710 and a middle node 716, the wire segment 722 is between a sink node 712 and the middle node 716, and the wire segment 724 is between the sink node 714 and the middle node 716. Schematic 700 can represent a two-dimensional routing tree for the example network. For some embodiments, based on the two-dimensional routing tree for the example network, a wirelength threshold for the example network can be determined by determining (e.g., calculating) a maximum distance value from each node of a two-dimensional routing tree to a sink node, and dividing the sum of all the determined maximum distance values by a wirelength (e.g., a total two-dimensional wirelength) of the example network. With respect to the example network illustrated by schematic 700, the wirelength threshold could be determined as follows:

$$\frac{0+0+1+2+3}{4} = 1.5$$

Schematic 702 illustrates the example network after performance of layer assignment based the determined wirelength threshold of the example network, according to some embodiments. As shown by schematic 702, the wire segment 720 is assigned to metal layer four (M4) or metal layer five (M5), and the wire segments 722, 724 are each assigned to metal layer two (M2) or metal layer three (M3).

Figure 8:
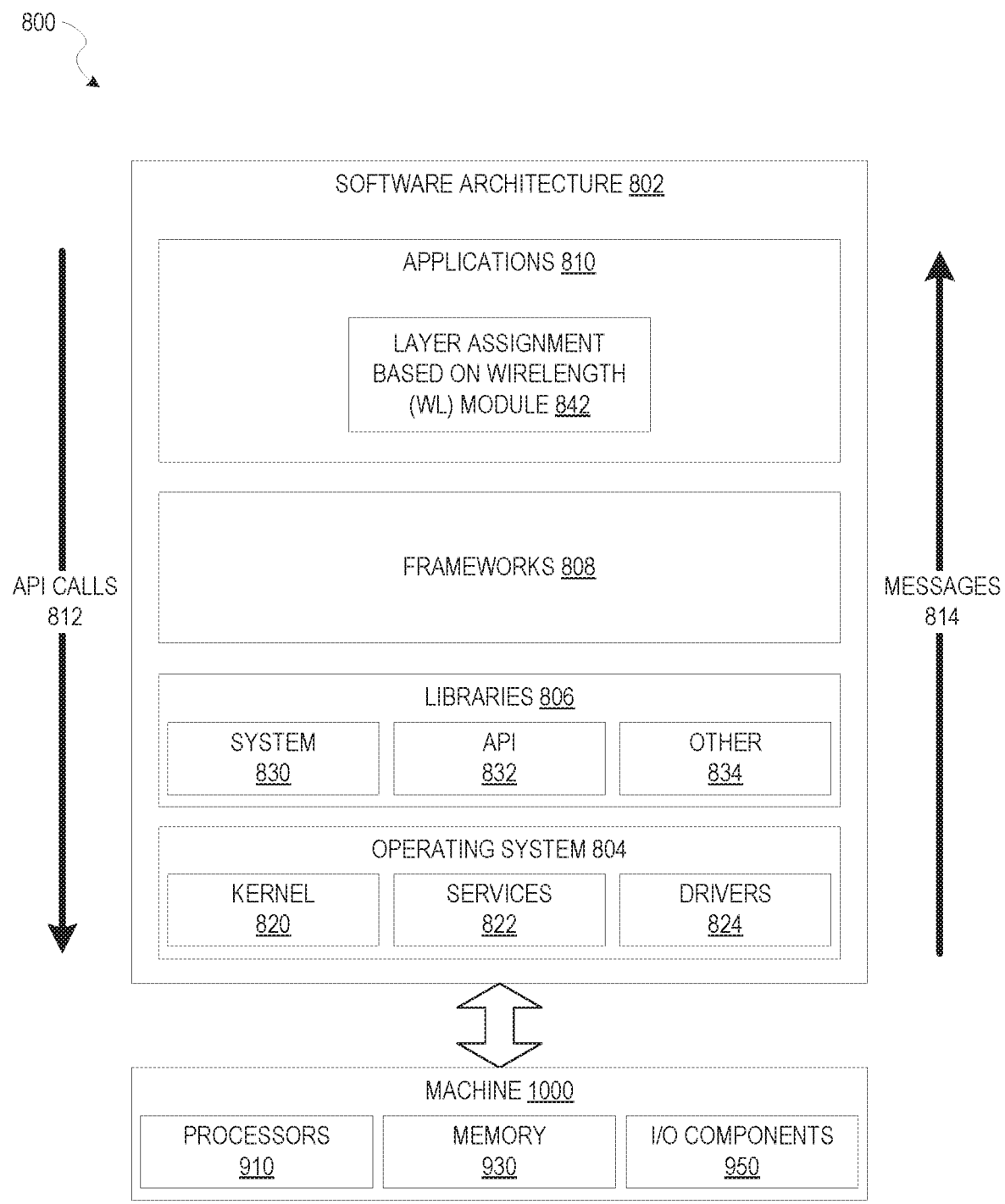
FIG. 8 is a block diagram illustrating an example of a software architecture that may be operating on an EDA computing device and may be used with methods for layer assignment of a network of a circuit design based on a wirelength threshold, according to some embodiments.

FIG. 8 is a block diagram 800 illustrating an example of a software architecture 802 that may be operating on an EDA computer and may be used with methods for layer assignment of a network of a circuit design based on a wirelength threshold, according to some embodiments. The software architecture 802 can be used as an EDA computing device to implement any of the methods described above. Aspects of the software architecture 802 may, in various embodiments, be used to store circuit designs, and to facilitate generation of a circuit design in an EDA environment by layer assignment of a network of a circuit design based on a wirelength threshold, from which physical devices may be generated.

FIG. 8 is merely a non-limiting example of a software architecture 802, and it will be appreciated that many other architectures can be implemented to facilitate the functionality described herein. In various embodiments, the software architecture 802 is implemented by hardware such as a machine 900 of FIG. 9 that includes processors 910 (e.g., hardware processors), memory 930, and input/output (I/O) components 950. In this example, the software architecture 802 can be conceptualized as a stack of layers where each layer may provide a particular functionality. For example, the software architecture 802 includes layers such as an operating system 804, libraries 806, software frameworks 808, and applications 810. Operationally, the applications 810 invoke application programming interface (API) calls 812 through the software stack and receive messages 814 in response to the API calls 812, consistent with some embodiments. In various embodiments, any client device, any server computer of a server system, or any other device described herein may operate using elements of the software architecture 802. An EDA computing device described herein may additionally be implemented using aspects of the software architecture 802, with the software architecture 802 adapted for operating to layer assignment in any manner described herein.

In some embodiments, an EDA application of the applications 810 performs layer assignment of a network of a circuit design based on a wirelength threshold according to embodiments described herein using various modules within the software architecture 802. For example, in some embodiments, an EDA computing device similar to the machine 900 includes the memory 930 and the one or more processors 910. The processors 910 also implement a layer assignment based on a wirelength (WL) module 842 (hereafter, the layer assignment module 842) for layer assignment of a network of a circuit design based on a wirelength threshold, in accordance with various embodiments described herein.

In various other embodiments, rather than being implemented as modules of the one or more applications 810, the layer assignment module 842 may be implemented using elements of the libraries 806, the operating system 804, or the software frameworks 808.

In various implementations, the operating system 804 manages hardware resources and provides common services. The operating system 804 includes, for example, a kernel 820, services 822, and drivers 824. The kernel 820 acts as an abstraction layer between the hardware and the other software layers, consistent with some embodiments. For example, the kernel 820 provides memory management, processor management (e.g., scheduling), component management, networking, and security settings, among other functionality. The services 822 can provide other common services for the other software layers. The drivers 824 are responsible for controlling or interfacing with the underlying hardware, according to some embodiments. For instance, the drivers 824 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 806 provide a low-level common infrastructure utilized by the applications 810. The libraries 806 can include system libraries 830 such as libraries of blocks for use in an EDA environment or other libraries that can provide functions such as memory allocation functions, string manipulation functions, mathematic functions, and the like. In addition, the libraries 806 can include API libraries 832 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 806 may also include other libraries 834.

The software frameworks 808 provide a high-level common infrastructure that can be utilized by the applications 810, according to some embodiments. For example, the software frameworks 808 provide various graphic user interface (GUI) functions, high-level resource management, high-level location services, and so forth. The software frameworks 808 can provide a broad spectrum of other APIs that can be utilized by the applications 810, some of which may be specific to a particular operating system 804 or platform. In various embodiments, the systems, methods, devices, and instructions described herein may use various files, macros, libraries, and other elements of an EDA design environment to implement layer assignment of a network of a circuit design based on a wirelength threshold as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 802, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose hardware processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 900 including processors 910), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 900, but deployed across a number of machines 900. In some embodiments, the processors 910 or processor-implemented modules are located in a single geographic location (e.g., within a home environment, an office environment, or a server farm). In some other embodiments, the processors or processor-implemented modules are distributed across a number of geographic locations.

Figure 9:
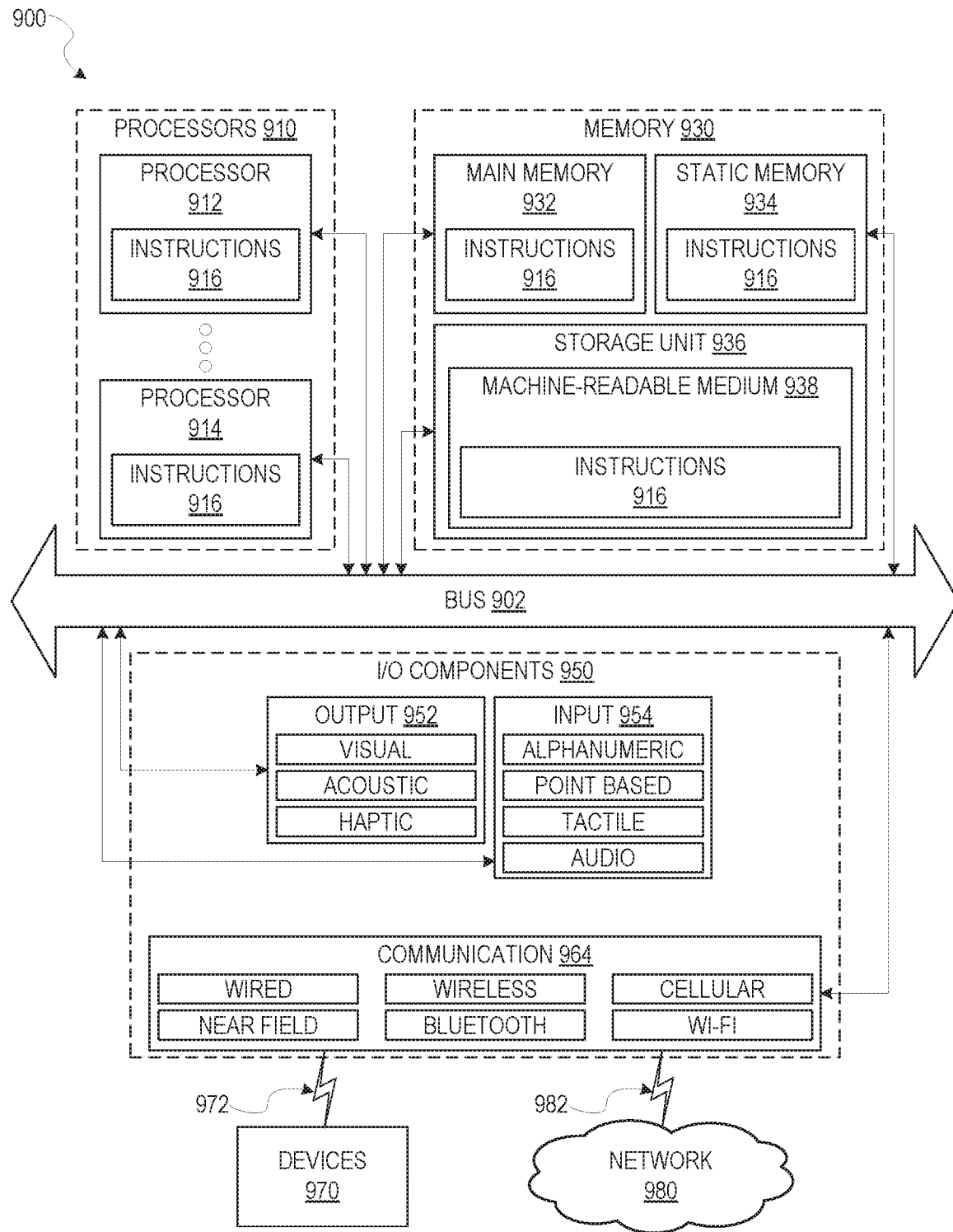
FIG. 9 is a diagram representing a machine in the form of a computer system within which a set of instructions are executed, causing the machine to perform any one or more of the methods discussed herein, according to some embodiments.

FIG. 9 is a diagrammatic representation of the machine 900 in the form of a computer system within which a set of instructions may be executed for causing the machine 900 to perform any one or more of the methodologies discussed herein, according to some embodiments. FIG. 9 shows components of the machine 900, which is, according to some embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a computer system, within which instructions 916 (e.g., software, a program, an application, an applet, an app, or other executable code) for causing the machine 900 to perform any one or more of the methodologies discussed herein can be executed. In alternative embodiments, the machine 900 operates as a standalone device or can be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 can comprise, but not be limited to, a server computer, a client computer, a personal computer (PC), a tablet computer, a laptop computer, a netbook, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

In various embodiments, the machine 900 comprises processors 910, memory 930, and I/O components 950, which can be configured to communicate with each other via a bus 902. In some embodiments, the processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 912 and a processor 914 that may execute the instructions 916. The term "processor" is intended to include multi-core processors 910 that may comprise two or more independent processors 912, 914 (also referred to as "cores") that can execute the instructions 916 contemporaneously. Although FIG. 9 shows multiple processors 910, the machine 900 may include a single processor 912 with a single core, a single processor 912 with multiple cores (e.g., a multi-core processor 912), multiple processors 910 with a single core, multiple processors 910 with multiple cores, or any combination thereof.

The memory 930 comprises a main memory 932, a static memory 934, and a storage unit 936 accessible to the processors 910 via the bus 902, according to some embodiments. The storage unit 936 can include a machine-readable medium 938 on which are stored the instructions 916 embodying any one or more of the methodologies or functions described herein. The instructions 916 can also reside, completely or at least partially, within the main memory 932, within the static memory 934, within at least one of the processors 910 (e.g., within the processor's cache memory), or any suitable combination thereof, during execution thereof by the machine 900. Accordingly, in various embodiments, the main memory 932, the static memory 934, and the processors 910 are considered machine-readable media 938.

As used herein, the term "memory" refers to a machine-readable medium 938 able to store data temporarily or permanently and may be taken to include, but not be limited to, random-access memory (RAM), read-only memory (ROM), buffer memory, flash memory, and cache memory. While the machine-readable medium 938 is shown, in some embodiments, to be a single medium, the term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., the instructions 916) for execution by a machine (e.g., the machine 900), such that the instructions, when executed by one or more processors of the machine (e.g., the processors 910), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 950 include a wide variety of components to receive input, provide output, produce output, transmit information, exchange information, capture measurements, and so on. In general, it will be appreciated that the I/O components 950 can include many other components that are not shown in FIG. 9. The I/O components 950 are grouped according to functionality merely for simplifying the following discussion, and the grouping is in no way limiting. In various embodiments, the I/O components 950 include output components 952 and input components 954. The output components 952 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 954 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 950 may include communication components 964 operable to couple the machine 900 to a network 980 or devices 970 via a coupling 982 and a coupling 972, respectively. For example, the communication components 964 include a network interface component or another suitable device to interface with the network 980. In further examples, the communication components 964 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 970 may be another machine or any of a wide variety of peripheral devices (e.g., a peripheral device coupled via a USB).

In various embodiments, one or more portions of the network 980 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling.

Furthermore, the machine-readable medium 938 is non-transitory (in other words, not having any transitory signals) in that it does not embody a propagating signal. However, labeling the machine-readable medium 938 "non-transitory" should not be construed to mean that the machine-readable medium 938 is incapable of movement; the machine-readable medium 938 should be considered as being transportable from one physical location to another. Additionally, since the machine-readable medium 938 is tangible, the machine-readable medium 938 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
   accessing, by a hardware processor, circuit design data that describes a network of a circuit design and that describes a plurality of layers of the circuit design;
   determining, by the hardware processor, a two-dimensional routing topology for the network, the two-dimensional routing topology for the network comprising a two-dimensional routing tree for the network;
   determining, by the hardware processor, a wirelength threshold for the network by:
   determining a set of maximum distance values for the network, the determining the set of maximum distance values comprising determining, for each current node in the two-dimensional routing tree, a maximum distance value from the current node to a sink of the network;
   determining a sum of the set of maximum distance values; and
   determining the wirelength threshold for the network by dividing the sum by a two-dimensional wirelength of the network;
   generating, by the hardware processor, layer assignment data for the circuit design, the generating comprising assigning a portion of the network to a given layer in the plurality of layers based on the wirelength threshold for the network; and
   generating, by the hardware processor, a circuit design layout based on the layer assignment data.

2. The method of claim 1, wherein the determining the two-dimensional routing topology for the network comprises generating the two-dimensional routing tree for the network.

3. The method of claim 1, further comprising:
   determining, by the hardware processor, the two-dimensional wirelength of the network.

4. The method of claim 1, wherein the determining the two-dimensional routing topology of the network comprises performing a global routing process on the network.

5. The method of claim 1, wherein the circuit design data further describes a plurality of pins for the network, and the determining the two-dimensional routing topology for the network comprises:
   determining the two-dimensional routing topology for the network based on the plurality of pins of the network.

6. The method of claim 1, wherein the portion comprises an edge of the two-dimensional routing tree, and wherein the assigning the portion of the network to the given layer in the plurality of layers based on the wirelength threshold for the network comprises:
   determining whether a given wirelength of the edge is less than the wirelength threshold for the network; and assigning the edge to the given layer based on the determining whether the given wirelength of the edge is less than the wirelength threshold for the network.

7. The method of claim 6, wherein the assigning the edge to the given layer based on the determining whether the given wirelength of the edge is less than the wirelength threshold for the network comprises:
  assigning the edge to a layer having a minimum via cost in response to determining that the given wirelength of the edge is less than the wirelength threshold of the network.

8. The method of claim 6, wherein the assigning the edge to the given layer based on the determining whether the given wirelength of the edge is less than the wirelength threshold for the network comprises:
  assigning the edge to a preferred layer in response to determining that the given wirelength of the edge is not less than the wirelength threshold of the network.

9. The method of claim 8, wherein the preferred layer comprises a high layer of the circuit design.

10. A device comprising:
  a memory storing instructions; and
  a hardware processor communicatively coupled to the memory and configured by the instructions to perform operations comprising:
    accessing circuit design data that describes a set of networks of a circuit design and that describes a plurality of layers of the circuit design;
    determining a two-dimensional routing topology for a given network in the set of networks, the two-dimensional routing topology for the network comprising a two-dimensional routing tree for the network;
    determining a wirelength threshold for the given network by:
      determining a set of maximum distance values for the network, the determining the set of maximum distance values comprising determining, for each current node in the two-dimensional routing tree, a maximum distance value from the current node to a sink of the network;
      determining a sum of the set of maximum distance values; and
      determining the wirelength threshold for the network by dividing the sum by a two-dimensional wirelength of the network; and
    generating layer assignment data for the circuit design, the generating comprising for at least the given network, assigning a portion of the given network to a given layer in the plurality of layers based on the wirelength threshold for the given network.

11. The device of claim 10, wherein the operations further comprise:
  prior to the generating the layer assignment data, sorting the set of networks based on an individual two-dimensional wirelength of each network in the set of networks.

12. The device of claim 11, wherein the operations further comprise:
  prior to the sorting of the set of networks, determining the individual two-dimensional wirelength of each network in the set of networks.

13. The device of claim 10, wherein the determining the two-dimensional routing topology for the given network comprises generating the two-dimensional routing tree for the given network.

14. The device of claim 10, wherein the operations further comprise:
  determining the two-dimensional wirelength of the given network.

15. The device of claim 10, wherein the portion comprises an edge of the two-dimensional routing tree, and wherein the assigning the portion of the given network to the given layer in the plurality of layers based on the wirelength threshold for the given network comprises:
  determining whether a given wirelength of the edge is less than the wirelength threshold for the given network; and
  assigning the edge to the given layer based on the determining whether the given wirelength of the edge is less than the wirelength threshold for the given network.

16. The device of claim 15, wherein the assigning the edge to the given layer based on the determining whether the given wirelength of the edge is less than the wirelength threshold for the given network comprises:
  assigning the edge to a layer having a minimum via cost in response to determining that the given wirelength of the edge is less than the wirelength threshold of the given network.

17. The device of claim 15, wherein the assigning the edge to the given layer based on the determining whether the given wirelength of the edge is less than the wirelength threshold for the given network comprises:
  assigning the edge to a preferred layer in response to determining that the given wirelength of the edge is not less than the wirelength threshold of the given network.

18. A non-transitory computer-readable medium comprising instructions that, when executed by a hardware processor of a device, cause the device to perform operations comprising:
  accessing circuit design data that describes a set of networks of a circuit design, that describes a set of two-dimensional routing topologies for the set of networks, and that describes a plurality of layers of the circuit design;
  generating a sorted set of networks by sorting the set of networks based on individual two-dimensional wirelengths of networks in the set of networks, the individual two-dimensional wirelengths of networks in the set of networks being determined based on the set of two-dimensional routing topologies;
  for each given network in the sorted set of networks being traversed in sort order:
    determining a given wirelength threshold for the given network based on a given two-dimensional routing topology in the set of two-dimensional routing topologies, the given two-dimensional routing topology being associated with the given network, the given two-dimensional routing topology comprising a given two-dimensional routing tree for the given network, the determining the given wirelength threshold comprising:
      determining a set of maximum distance values for the given network, the determining the set of maximum distance values comprising determining, for each current node in the given two-dimensional routing tree, a maximum distance value from the current node to a sink of the Riven network;
      determining a sum of the set of maximum distance values; and determining the given wirelength threshold for the given network by dividing the sum by a two-dimensional wirelength of the given network; and generating layer assignment data for the circuit design, the generating comprising assigning a portion of the given network to a given layer in the plurality of layers based on the given wirelength threshold for the given network; and generating a circuit design layout based on the layer assignment data.

19. The non-transitory computer-readable medium of claim 18, wherein the operations further comprise:

determining the set of two-dimensional routing topologies by performing a global routing process on the set of networks.

20. The non-transitory computer-readable medium of claim 18, wherein the circuit design data further describes a plurality of pins for the set of networks, and the operations further comprise:

determining the set of two-dimensional routing topologies based on the plurality of pins.

\* \* \* \* \*